United States Patent [19]

van de Grijp

[11] 4,363,133

[45] Dec. 7, 1982

[54] CONVERTER CIRCUIT FOR TELEVISION SIGNALS

[75] Inventor: Abram van de Grijp, Eindhoven, Netherlands

[73] Assignee: U.S. Philips Corporation, New York, N.Y.

[21] Appl. No.: 182,261

[22] Filed: Aug. 28, 1980

[51] Int. Cl.³ .......................... H04B 1/18; H04B 1/26
[52] U.S. Cl. .................................... 455/131; 455/161; 455/190; 455/197; 455/315
[58] Field of Search ............... 455/131, 150, 161, 190, 455/193, 197, 619, 3, 142, 271, 280, 283, 293, 314–316, 4; 358/86

[56] References Cited

U.S. PATENT DOCUMENTS

| | | | |
|---|---|---|---|
| 2,618,743 | 11/1952 | Scherbatsky | 455/2 |
| 2,958,771 | 11/1960 | Mural et al. | 455/161 |
| 3,519,939 | 7/1970 | Tashima | 455/193 |
| 3,657,543 | 4/1972 | Rose | 455/619 |
| 4,169,993 | 10/1979 | Taylor et al. | 455/161 |

Primary Examiner—Marc E. Bookbinder

Attorney, Agent, or Firm—Thomas A. Briody; William J. Streeter; Laurence A. Wright

[57] ABSTRACT

A RF signal converter circuit for connection to the aerial input of an RF superheterodyne receiver. In order to avoid a separate remote control of the converter circuit use is made of the local oscillator radiation which is present at the aerial input of a RF-superheterodyne receiver as an indication of the tuning frequency selected by the user with tuning portion of the said RF superheterodyne receiver. The converter circuit comprises a frequency search circuit in which the frequency of the oscillator radiation is detected, an RF signal selector which is controlled by the frequency search circuit and by means of which the desired RF signal is selected from the RF signals applied to the converter circuit, furthermore comprising a modulator which is also controlled by the frequency search circuit and in which the selected RF signal is modulated on a carrier frequency which is determined by the tuning frequency and the intermediate frequency of the RF superheterodyne receiver.

5 Claims, 1 Drawing Figure

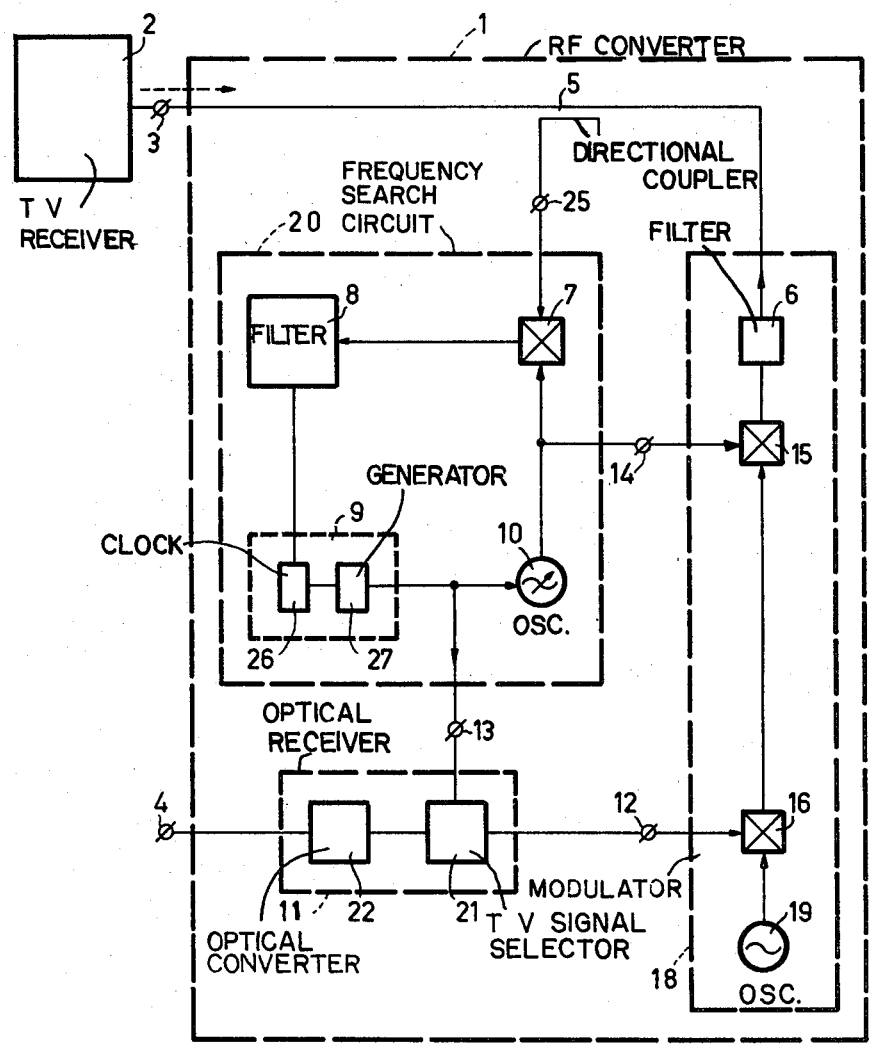

CONVERTER CIRCUIT FOR TELEVISION SIGNALS

The invention relates to a converter circuit for RF signals having a signal input and a signal output for connection to the aerial input of an RF superheterodyne receiver, comprising a cascade arrangement of an RF signal selector and a modulator connected between the signal input and the signal output.

BACKGROUND OF THE INVENTION

Such a converter circuit is disclosed in German patent application No. 2,205,193 which has been laid open to public inspection, and is used as an adaptor for a TV receiver to enable TV signals which are outside the standard TV frequency range to be displayed. When using this known circuit the tuning section of the TV receiver is fixedly adjusted to a given TV channel. Selection and conversion of a desired TV signal, which is possibly located outside the standard TV frequency range, to the channel to which the TV receiver has been tuned is effected in the converter circuit. The tuning is varied by operating the converter circuit.

The use of this known converter circuit results in a change in the manner of tuning with which the user must be acquainted. In addition, when the user has a TV receiver with remote control, this convenient feature is lost and he is compelled to operate the converter circuit to tune his TV receiver.

SUMMARY OF THE INVENTION

It is an object of the invention to provide a converter circuit which does not affect the manner of tuning a TV or radio receiver. According to the invention, a converter circuit of the type described in the opening paragraph is therefore characterized in that the converter circuit also comprises a coupling circuit connected to the signal output for coupling the oscillator radiation present at the aerial input of an RF superheterodyne receiver to a frequency search circuit which is connected to the coupling circuit, one output of the search circuit being coupled to the RF signal selector to control the selection of an RF signal from the signals applied to the signal input, another output thereof being coupled to the modulator to control modulation of the selected RF signal on a carrier frequency.

The invention is based on the recognition of the fact that for normal RF superheterodyne receivers the local oscillator signal is parasitically radiated to the aerial input with a measurable amplitude. The frequency of this oscillator radiation indicates the transmitter frequency to which the receiver has been tuned and, consequently, the RF signal which must be applied to the aerial input.

When the measure according to the invention is used, the information as regards the desired RF signal is detected in the frequency search circuit on the basis of the frequency of the oscillator radiation. This information is used to control the RF signal selector, causing the desired RF signal to be selected from the RF signals which are applied to the RF signal selector by way of the signal input, and a modulator which modulates the selected, desired RF signal on a carrier frequency which is determined by the local oscillator frequency. The RF signal obtained in this manner can be processed further and displayed in the customary manner by the RF superheterodyne receiver connected to the converter circuit.

As the converter circuit in accordance with the invention is controlled by the local oscillator frequency of an RF receiver coupled to the converter circuit, the normal manner of tuning the receiver by means of the tuning portion of the RF receiver, which can be operated directly or remotely, is not changed.

A preferred embodiment of a converter circuit according to the invention is characterized in that the coupling circuit comprises a directional coupler.

When this measure is used, the oscillator radiation is passed on to the frequency search circuit almost most without any attenuation, whereas transmission of the RF signals at the signal output to the frequency search circuit is considerably suppressed.

A further preferred embodiment of a converter circuit according to the invention is characterized in that the frequency search circuit comprises a controllable oscillator a central input of which is connected to a control circuit and an output of which is coupled to a first input of a first mixer stage, this first mixer stage also having a second input to which the coupling circuit is coupled, and also having an output which is coupled to the control circuit by way of a filtering element.

Such a frequency search circuit is known per se from U.S. Pat. No. 2,618,743. When, however, such a frequency search circuit is used in the converter circuit according to the invention advantageous use is made of the availability of the information about the local oscillator frequency, on the one hand in the form of a direct voltage control signal at the output of the control circuit and on the other hand in the form of a signal frequency at the output of the controllable oscillator. This renders a simple control of the RF signal selector and the modulator possible.

BRIEF DESCRIPTION OF THE DRAWING

The invention will be further described by way of non-limitative example with reference to the sole FIGURE of the accompanying drawing.

The FIGURE shows a converter circuit 1 according to the invention, having an optical signal input 4 and a signal output 3, which is connected to an aerial input of a TV superheterodyne receiver 2.

DETAILED DESCRIPTION OF THE PREFERRED EMBODIMENTS

The converter circuit comprises a frequency search circuit 20, which has an input 25 which functions as a coupling circuit. A first output 13 of the frequency search circuit 20 is coupled to a control input of a TV signal selector 21, which serves as an RF signal selector and is part of an optical receiver 11. The optical receiver 11 also comprises an optical-to-electrical signal converter 22, which is connected between the optical signal input 4 and TV signal selector 21. An output 12 of the TV signal selector 21 is coupled to a modulator 18, as is a second output 14 of the frequency search circuit 20. The modulator 18 is coupled to the signal output 3.

The frequency search circuit 20 comprises a first mixer stage 7 having first and second input which are fed from the directional coupler 5 and a controllable oscillator 10, respectively. An output of the mixer stage 7 is coupled to a control circuit 9 through a low-pass filter 8. An output of the control circuit 9 is coupled to a control input of the controllable oscillator 10 and also to the first output 13 of the frequency search circuit 20.

The connection between the controllable oscillator 10 and the first mixer stage 7 is coupled to the second output 14 of the frequency search circuit 20.

The control circuit 9 comprises a clock 26 which is connected to the low-pass filter and which drives a staircase generator 27. The staircase generator 27 applies a step-wise varying control voltage ramp to the controllable oscillator 10. The controllable oscillator 10 sweeps in each ramp period over a frequency range corresponding to the tuning range of the local oscillator of TV receiver 2. When an input signal is applied from the low-pass filter 8 to the clock 26, the latter is deactivated and the control voltage then obtained is retained. This ends the sweeping procedure. In an alternative embodiment, not shown, of the control circuit 9, the staircase generator is replaced by a sawtooth oscillator and the frequency of the controllable oscillator 10 is varied continuously over the abovementioned frequency range. A switching device deactivates the sawtooth oscillator at a certain value of the control voltage when an input signal is received which is fed from the low-pass filter 8 to the control circuit 9, causing the sweep procedure to be ended. As a detailed knowledge about the operation of the control circuit 9 is of no importance for an understanding of the invention a further description is not given.

The oscillator radiation of the TV superheterodyne receiver 2 which radiation is present at the aerial input is applied almost without attenuation via the directional coupler 5 to first mixer stage 7 of the frequency search circuit 20 where it is multiplied by the signal from controllable oscillator 10. When the varying frequency of the signal from the controllable oscillator 10 attains the frequency of the local oscillator of T.V. receiver 2, a direct voltage product is produced at the output of the mixer stage 7, which product passes through low-pass filter 8 and locks the control voltage produced by control circuit 9 at the value then attained. This causes oscillator 10 to be locked onto the frequency of the local oscillator of TV receiver 2.

Via the first output 13 of frequency search circuit 20 the control voltage from control circuit 9 controls the TV signal selector 21 of optical receiver 11. This causes the TV signal desired by the user to be selected from the TV signals applied by the optical-to-electrical signal converter 22 to the TV signal selector 21. The selected, desired TV signal appears in the basic frequency band (0 to 5.5 MHz) at output 12 of TV signal selector 21. As a detailed knowledge about the operation of the optical receiver 11 is of no importance for an understanding of the invention no further description is given. For further information about optical receivers, reference may be made to "An Optical Transmitter and Receiver for Two-way Wavelength-Division-Multiplexing Transmission in the 0.75 μm Wavelength Region", by H. Ishio, K. Osafune, H. Nakamura and K. Miyazaki, published in "Fourth ECOC, Genova", Sept. 12-15, 1978, pages 449-458.

The desired basic-frequency band TV signal thus obtained at output 12 is applied to a second mixer stage 16 included in modulator 18, where a first modulation process is effected by multiplying this TV signal by the output signal of a fixed frequency oscillator 19 connected to second mixer stage 16. The frequency of fixed frequency oscillator 19 is chosen to be equal to the intermediate frequency of the TV superheterodyne receiver 2.

An output of second mixer stage 16 is coupled to an input of third mixer stage 15, where a second modulation process is effected by multiplying the TV signal, modulated on the TV intermediate frequency, by the signal from controllable oscillator 10 connected to the mixer stage 15. As mentioned hereinbefore, the frequency of controllable oscillator 10 is equal to the local oscillator frequency.

In order to select from the mixed products at the output of mixer stage 15 a TV signal to be processed by the TV receiver 2, this output is coupled to a band-pass filter 6 which passes the TV signal that is modulated on a carrier frequency equal to the sum of the said TV intermediate frequency and the TV receiver 2 local oscillator frequency. This TV signal, modulated on this carrier frequency, is applied to TV superheterodyne receiver 2 via the output of modulator 18.

Alternative constructions, embodying the invention, of the converter circuit 1 are of course possible. One of these possibilities is to include in the modulator 18 only one mixer stage in which, in one single modulation process, the basic frequency band TV signal at the output 12 of the TV signal selector 21 is modulated on said carrier frequency. The low-pass filter 8 must then be replaced by a band-pass filter, so that the controllable oscillator 10 can be locked onto the required carrier frequency. The sweeping range of the controllable oscillator 10 must then of course be shifted by an amount equal to the intermediate frequency.

It is alternatively possible to choose a frequency for the fixed frequency oscillator 19 which is not equal to the TV intermediate frequency. In that case the low-pass filter 8 must again be replaced by a band-pass filter.

Although the converter circuit shown in the drawing is used in fibre optic CATV networks it will be clear that the inventive idea is also used when the converter circuit 1 is made suitable for use in conventional CATV networks by simply replacing the optical receiver 11 by a known electric TV-tuner.

It should be noted that the invention is not limited to the conversion of only TV signals. In a manner which will be obvious for a person having normal skill in the art, the converter circuit 1 can be made suitable for the conversion of other RF signals.

What is claimed is:

1. A RF signal converter circuit positioned externally to a superheterodyne receiver, said converter circuit having a signal input and a signal output, said output being connected to the RF aerial input of said superheterodyne receiver, said converter circuit comprising:

a cascade arrangement of a RF signal selector which provides a selected and modified RF signal and a modulator connected between the signal input and the signal output of said converter, said converter circuit also comprising a coupling circuit connected to said RF aerial signal input and said converter signal output for coupling oscillator radiation present at the aerial input of said RF superheterodyne receiver, a frequency search circuit connected to said coupling circuit for receiving said oscillator radiation present at the aerial input of said RF receiver, one output of said frequency search circuit being coupled to said RF signal selector to control the selection of a RF signal from RF signals applied to a signal input of said signal selector, another output thereof being coupled to said modulator to control modulation of the selected and modified RF signal onto a carrier frequency.

2. A converter circuit as claimed in claim 1, wherein said coupling circuit comprises a directional coupler.

3. A converter circuit as claimed in claim 1 wherein said frequency search circuit comprises a first mixer stage, a controllable oscillator, an input of which is connected to a control circuit and an output of which is coupled to a first input of said first mixer stage, said first mixer stage having a second input to which said coupling circuit is coupled and also having an output which is coupled to said control circuit through a filter element.

4. A converter circuit as claimed in claim 1 wherein said RF signal selector comprises an optical converter device for converting optical RF signals into electric RF signals.

5. A RF signal converter circuit positioned externally to a superheterodyne receiver, said converter circuit having a signal input and a signal output said output being connected to the aerial RF input of said superheterodyne receiver, said converter circuit comprising:
   a cascade arrangement of a RF signal selector which provides a selected and modified RF signal and a modulator connected between the signal input and the signal output of said converter,
   said converter also comprising a directional coupler connected to said RF aerial signal input and said converter signal output for coupling oscillator radiation present at the aerial input of said RF superheterodyne receiver,
   a frequency search circuit connected to said directional coupler for receiving said oscillator radiation, a first output of said frequency search circuit being coupled to said RF signal selector to control selections of a RF signal from RF signals applied to a signal input of said signal selector, a second output thereof being coupled to said modulator to control modulation of the selected and modified RF signal onto a carrier frequency,
   said frequency search circuit comprising a first mixer stage, a control circuit, a first filter element and a controllable oscillator, an input of said controllable oscillator is connected to said control circuit and an output of said controllable oscillator is coupled to a first input of said first mixer stage, said first mixer stage also having a second input to which said directional coupler is connected, and also having an output which is coupled to said control circuit through said first filter element,
   said modulator comprising a second filter element and a second mixer stage an input of which is connected to a fixed frequency oscillator, and
   a third mixer stage an input of which is connected to said second output of said frequency search circuit, said second and third mixer stages being arranged in cascade between the RF signal selector and the second filter element, an output of which is coupled to the signal output of said converter, said second filter element being a low-pass filter and the frequency of said fixed frequency oscillator being equal to the intermediate frequency of said RF superheterodyne receiver coupled to said converter signal output.

* * * * *